(12) United States Patent
Oka et al.

(10) Patent No.: US 8,235,735 B2
(45) Date of Patent: Aug. 7, 2012

(54) TERMINAL JOINING STRUCTURE AND TERMINAL JOINING METHOD

(75) Inventors: Kohei Oka, Tokyo (JP); Shozo Sakaue, Hyogo (JP); Shunichi Kitayama, Hyogo (JP); Yoichi Hisamori, Tokyo (JP); Yoshitaka Ono, Tokyo (JP); Toshikazu Karita, Tokyo (JP); Tetsuya Takahashi, Tokyo (JP)

(73) Assignees: Mitsubishi Electric Corporation, Chiyoda-Ku, Tokyo (JP); Ryoden Kasei Co., Ltd., Sanda-Shi, Hyogo (JP)

( * ) Notice: Subject to any disclaimer, the term of this patent is extended or adjusted under 35 U.S.C. 154(b) by 189 days.

(21) Appl. No.: 12/865,635

(22) PCT Filed: Jan. 30, 2008

(86) PCT No.: PCT/JP2008/051432
§ 371 (c)(1),
(2), (4) Date: Jul. 30, 2010

(87) PCT Pub. No.: WO2009/096013
PCT Pub. Date: Aug. 6, 2009

(65) Prior Publication Data
US 2011/0003519 A1    Jan. 6, 2011

(51) Int. Cl.
*H01R 4/06* (2006.01)
(52) U.S. Cl. .......................................... 439/84; 29/844
(58) Field of Classification Search ............... 439/84, 439/741; 29/512, 844
See application file for complete search history.

(56) References Cited

U.S. PATENT DOCUMENTS

| | | | | |
|---|---|---|---|---|
| 1,912,653 A | * | 6/1933 | Olson | 29/874 |
| 2,414,897 A | * | 1/1947 | Rickmeyer | 174/554 |
| 2,782,491 A | * | 2/1957 | Cole | 29/860 |
| 2,948,773 A | * | 8/1960 | Hawes | 174/153 R |
| 3,037,276 A | * | 6/1962 | Woods | 29/512 |
| 3,445,929 A | * | 5/1969 | Wolf | 29/844 |
| 4,753,615 A | | 6/1988 | Weidler et al. | |

(Continued)

FOREIGN PATENT DOCUMENTS

JP     62-118351 U     7/1987

(Continued)

OTHER PUBLICATIONS

International Search Report (PCT/ISA/210) issued on Feb. 26, 2008, by Japanese Patent Office as the International Searching Authority for International Application No. PCT/JP2008/051432.

(Continued)

*Primary Examiner* — Neil Abrams
(74) *Attorney, Agent, or Firm* — Buchanan Ingersoll & Rooney PC (57) ABSTRACT

A terminal joining structure includes a terminal having a tubular barrel portion and a flange portion that is integrally formed at the axis-direction end of the barrel portion, a conductor substrate on which is opened a through-hole for inserting the barrel portion, and a ring that fits on the barrel portion on the opposite side of the conductor substrate. On the barrel portion is formed a taper that increases in diameter toward the flange portion. The diameter of the larger-diameter portion of the taper is larger than the inner diameter of the through-hole. The terminal is caulked to cause radially outward expansion of an end part of the barrel portion, which passes through the ring, on the opposite side of the conductor substrate and is fixed to the conductor substrate together with the ring.

13 Claims, 9 Drawing Sheets

U.S. PATENT DOCUMENTS

| | | | | |
|---|---|---|---|---|
| 4,812,130 A | * | 3/1989 | Altenschulte et al. | 439/84 |
| 5,046,971 A | * | 9/1991 | Ruggiero et al. | 439/741 |
| 5,365,654 A | | 11/1994 | Moulton | |
| 5,381,598 A | * | 1/1995 | Adachi et al. | 29/845 |

FOREIGN PATENT DOCUMENTS

| | | |
|---|---|---|
| JP | 62-162304 A | 7/1987 |
| JP | 06-064421 A | 3/1994 |
| JP | 07-192791 A | 7/1995 |
| JP | 07-249882 A | 9/1995 |

OTHER PUBLICATIONS

Written Opinion (PCT/ISA/237) issued on Feb. 26, 2008, by Japanese Patent Office as the International Searching Authority for International Application No. PCT/JP2008/051432.

Supplementary European Search Report dated Apr. 21, 2011, issued in the corresponding European Patent Application No. 08704195.0-1231.

* cited by examiner

| RING CHAMFER SHAPE | | TERMINAL | | SUBSTRATE HOLE | | | ROTATIONAL RESISTANCE TORQUE (FIXING STRENGTH) | SUBSTRATE SURFACE PRESSURE STABILITY (ADHESIVENESS) |
|---|---|---|---|---|---|---|---|---|
| ANGLE | DEPTH | GRADIENT ANGLE | GRADIENT DEPTH | DIAMETER OF PREPARED HOLE | DIAMETER OF SMALL-DIAMETER HOLES | NUMBER OF SMALL-DIAMETER HOLES | | |
| 30° | 1.0 mm | 10° | 1.0 mm | ⌀1.5 mm | ⌀1.0 mm | 32 | MODERATE | MODERATE |
| | | | 1.0 mm | | | 16 | HIGH | POOR |
| | | | 1.5 mm | | | 24 | HIGH | POOR |
| | | | 1.5 mm | | | 32 | HIGH | POOR |
| | | | 1.0 mm | | ⌀2.0 mm | 16 | MODERATE | GOOD |
| | | | 1.0 mm | | | 20 | LOW | EXCELLENT |
| | | | 1.5 mm | | ⌀2.0 mm | 16 | MODERATE | GOOD |
| | | | 1.5 mm | | | 20 | LOW | EXCELLENT |

TERMINAL JOINING STRUCTURE AND TERMINAL JOINING METHOD

TECHNICAL FIELD

The present invention relates to a terminal joining structure for high current usage including a conductor substrate such as a busbar, a circuit board, or a laminated structure of a circuit board and a substrate parallel body, as well as including a terminal such as a bush or a fastener and relates to a terminal joining method.

BACKGROUND ART

In a conventional terminal joining structure for high current usage and a terminal joining method therefor, a flange portion is formed at one end of a tubular terminal body and a pair of protrusions are formed at the outer periphery of that end of the terminal body which is on the opposite side of the flange portion. Besides, a hole for inserting the tubular terminal body is formed on a conductor substrate and grooves through which the protrusions can pass on the inner surface of the hole are formed. Upon inserting the terminal body in the hole, the terminal is rotated for shifting the positions of the projections and the grooves out of alignment so that the conductor substrate is sandwiched between the projections and the flange portion. In that condition, the terminal body is soldered to the conductor substrate. Thus, the terminal body is fixed to the conductor substrate by performing clamping using the projections and the flange portion and performing soldering (e.g., see Patent Literature 1).
Patent Literature 1: Japanese Patent Application Laid-open No. H7-249882

DISCLOSURE OF INVENTION

Problem to be Solved by the Invention

In the conventional terminal joining structure for high current usage and the terminal joining method therefor as described above, joining with the use of soldering or brazing leads to an increase in the number of steps during the manufacturing process, which runs counter to cutting down the manufacturing cost. Moreover, in the conventional terminal joining structure, the joint region of the terminal and the conductor substrate is weak in mechanical strength. Hence, if exposed to a high screw tightening torque, there is a possibility that the joint region rotates.

The present invention has been made to solve the above problems in the conventional technology and it is an object of the present invention to provide a terminal joining structure and a terminal joining method that enable achieving simplification in the manufacturing process and achieving a strong joining force.

Means for Solving Problem

To solve the above problems and achieve the object, a terminal joining structure of an aspect of the present invention includes: a terminal including a tubular barrel portion and a flange portion that is integrally formed at an axis-direction end of the barrel portion; a conductor substrate on which a through-hole for inserting the barrel portion is opened; and a ring that fits on the barrel portion on opposite side of the conductor substrate, wherein a taper that increases in diameter toward the flange portion is formed on the barrel portion, diameter of a larger-diameter portion of the taper being larger than inner diameter of the through-hole, and the terminal is caulked to cause radially outward expansion of an end, on the opposite side of the conductor substrate, of the barrel portion passing through the ring and is fixed to the conductor substrate together with the ring.

A terminal joining structure of another aspect of the present invention includes: a terminal including a barrel portion that has a male screw threaded on outer periphery and a flange portion that is integrally formed at an axis-direction end of the barrel portion; a conductor substrate on which is opened a through-hole for inserting the barrel portion; and a ring that has a female screw threaded on inner periphery and that is fastened to the barrel portion on opposite side of the conductor substrate, wherein on the barrel portion is formed a taper that increases in diameter toward the flange portion, diameter of a larger-diameter portion of the taper being larger than inner diameter of the through-hole.

A terminal joining method of an aspect of the present invention includes: opening a through-hole on a conductor substrate for fixing a terminal; forming, on a barrel portion of a terminal that includes the barrel portion in tubular shape and a flange portion that is integrally formed at an axis-direction end of the barrel portion, a taper that increases in diameter toward the flange portion, diameter of a larger-diameter portion of the taper being larger than inner diameter of the through-hole; fitting, upon inserting the barrel portion in the through-hole, a ring on the barrel portion on opposite side of the conductor substrate; and fixing that includes caulking the terminal to cause radially outward expansion of an end, on the opposite side of the conductor substrate, of the barrel portion that passes through the ring and fixing the terminal to the conductor substrate together with the ring.

A terminal joining method of another aspect of the present invention includes: opening a through-hole on a conductor substrate to which a terminal is fixed; forming, on a barrel portion of a terminal that includes the barrel portion that has a male screw threaded on outer periphery and a flange portion that is integrally formed at an axis-direction end of the barrel portion, a taper that increases in diameter toward the flange portion, diameter of a larger-diameter portion of the taper being larger than inner diameter of the through-hole; and fitting, upon inserting the barrel portion in the through-hole, a ring that has a female screw threaded on inner periphery on the barrel portion on opposite side of the conductor substrate.

Effect of the Invention

According to an aspect of the present invention, it is possible to achieve a pronounced advantage over the conventional technology since just a simple manufacturing process of caulking or screw-coupling the ends of a terminal that sandwiches a conductor substrate enables achieving a joining force. Moreover, a strong joining force may be achieved by making a taper formed on a barrel portion of the terminal cause plastic deformation in the rim of a through-hole on the conductor substrate so that the rim is expanded outward.

EXPLANATIONS OF LETTERS OR NUMERALS 10, 10B, 110 Ring
10a Edge face of ring on axis-direction substrate-side
10b Female screw of ring
11A Outside chamfer
11B Substrate-side chamfer
20, 120, 220 Conductor substrate (busbar)
120a, 220a Serrations on through-hole rim
21, 121, 221 Through-hole
30, 30B, 130 Terminal
31, 31B, 131 Tubular barrel portion
31a Plastically-deforming part of barrel-portion opening edge
31b Male screw threaded on tubular barrel portion
32, 132 Flange portion
32a Edge face of flange portion on axis-direction substrate-side
32b Female screw threaded on inner peripheral surface of flange portion
33 Taper
32a Edge face of flange portion on axis-direction conductor-substrate-side
40, 50 Caulking pin for fastening
40a, 50a Pressing surface of caulking pin for fastening
41, 51 Ring holding member

BEST MODE(S) FOR CARRYING OUT THE INVENTION

Exemplary embodiments of a terminal joining structure and a terminal joining method according to the present invention are described in detail below with reference to the accompanying drawings. The present invention is not limited to these exemplary embodiments.

First Embodiment

Figure 1:
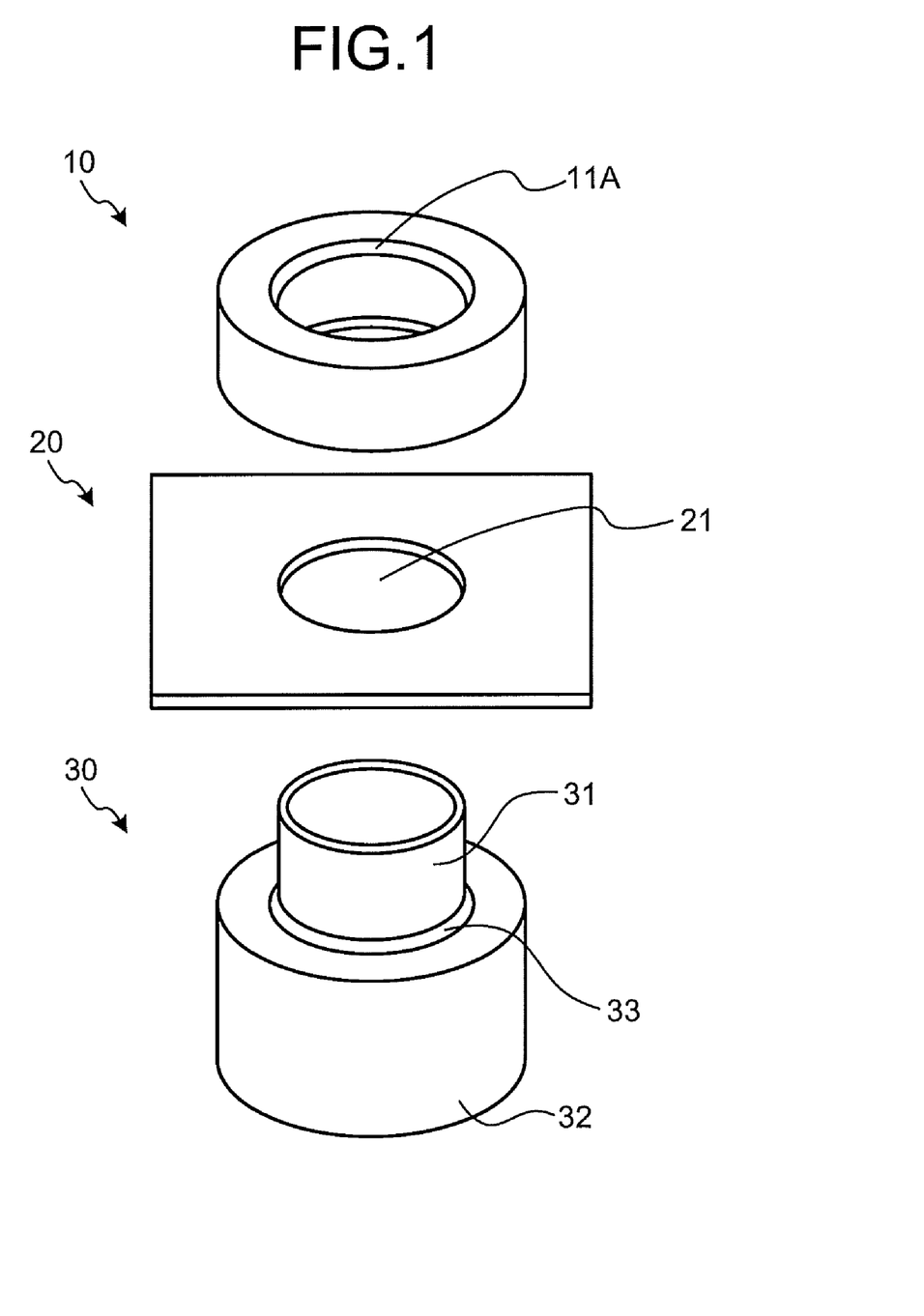
FIG. 1 is an exploded perspective view of a terminal joining structure for explaining a terminal joining structure and a terminal joining method according to a first embodiment of the present invention.
Figure 2:
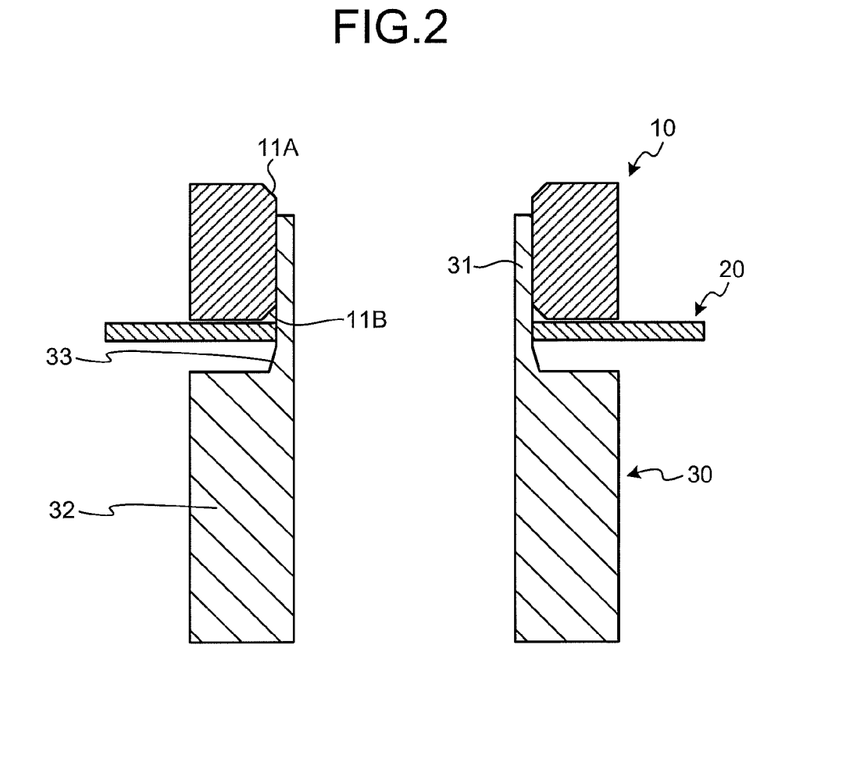
FIG. 2 is a transverse sectional view of the terminal joining structure during joining of a terminal to a conductor substrate according to the first embodiment.
Figure 3:
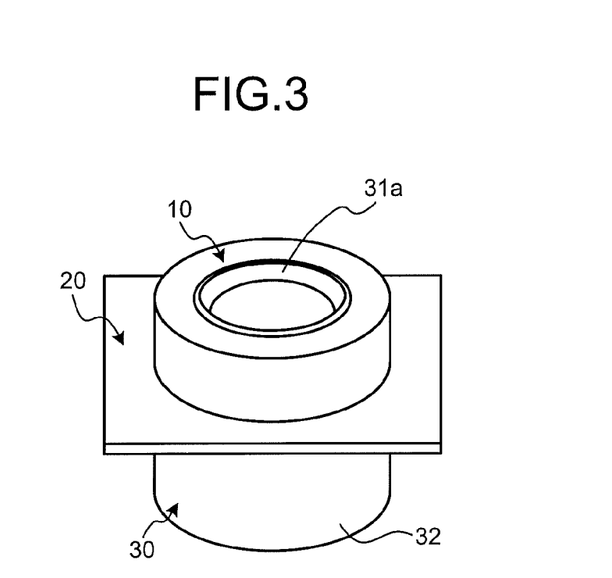
FIG. 3 is a perspective view of the terminal joining structure upon completion of joining the terminal to the conductor substrate according to the first embodiment.
Figure 4:
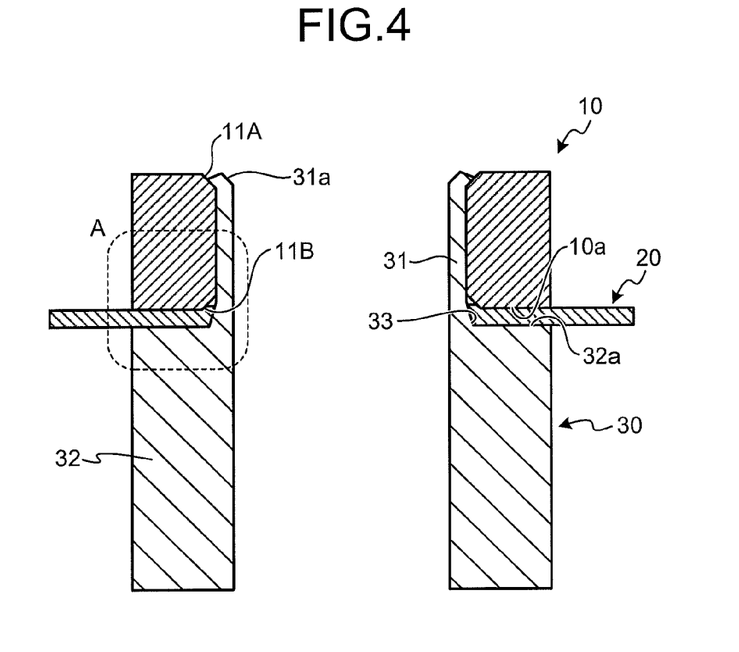
FIG. 4 is a transverse sectional view of the terminal joining structure upon completion of joining the terminal to the conductor substrate according to the first embodiment.
Figure 5:
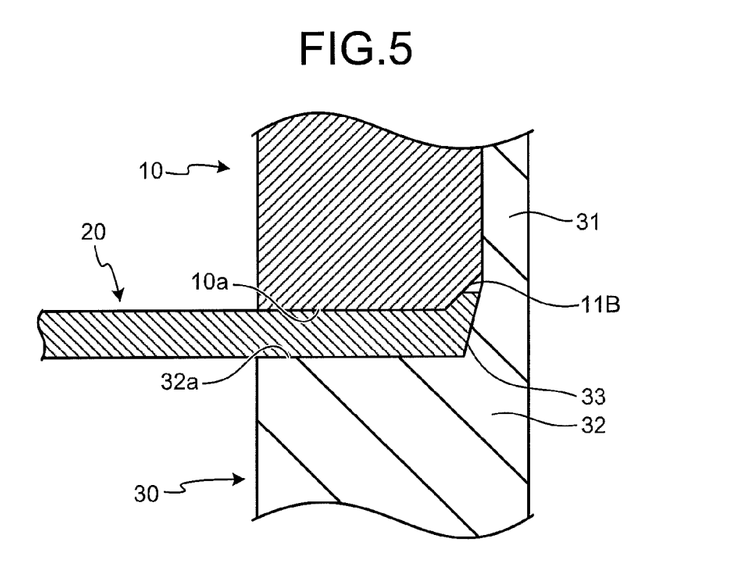
FIG. 5 is an enlarged transverse sectional view of portion A illustrated in FIG. 4.

FIG. 1 is an exploded perspective view of a terminal joining structure for explaining a terminal joining structure and a terminal joining method according to a first embodiment of the present invention. FIG. 2 is a transverse sectional view of the terminal joining structure during joining of a terminal to a conductor substrate. FIG. 3 is a perspective view of the terminal joining structure upon completion of joining the terminal to the conductor substrate. FIG. 4 is a transverse sectional view of the terminal joining structure upon completion of joining the terminal to the conductor substrate. FIG. 5 is an enlarged transverse sectional view of portion A illustrated in FIG. 4.

In the terminal joining structure according to the present embodiment, a terminal 30 is joined to a conductor substrate (busbar) 20. Although the conductor substrate 20 has, in practice, a greater two-dimensional expansion than the dimensions illustrated in drawings; in FIGS. 1 and 3, a complete diagrammatic representation thereof is not given and only the portion in the vicinity of the terminal 30 is illustrated in a cut-out manner in a rectangular shape. The terminal joining structure includes the terminal 30, the conductor substrate 20, and a ring 10. The conductor substrate 20 is manufactured from, for example, copper as an electrically-conductive material having plastic deformability and has a through-hole 21 opened thereon for fixing the terminal 30.

The terminal 30 is manufactured from a metal stock of, for example, copper or the like and includes a thin tubular barrel portion 31 and a thick tubular flange portion 32 that is integrally formed at the axis-direction end of the barrel portion 31. The outer diameter of the barrel portion 31 is such that fitting thereof in the through-hole 21 results in a clearance fit. In between the barrel portion 31 and the flange portion 32 is formed a taper 33 that decreases in diameter toward the barrel portion 31 and increases in diameter toward the flange portion 32. The diameter of the larger-diameter portion of the taper 33 is larger than the through-hole 21 formed on the conductor substrate 20.

The ring 10 is manufactured from a metal stock of, for example, copper or the like and fits on the barrel portion 31 on the opposite side of the conductor substrate 20. In the center of the ring 10 is formed a through-hole for inserting the barrel portion 31 of the terminal 30. Moreover, the through-hole has a substrate-side chamfer 11B formed on the end at the side of the conductor substrate 20 and has an outside chamfer 11A formed on the end on the opposite side of the conductor substrate 20.

The barrel portion 31 of the terminal 30 may be formed to have a thickness in the range of about 50% to about 300% with respect to the thickness of the conductor substrate 20. However, a very low thickness of the barrel portion 31 weakens the strength thereof against the load in the axis direction. On the other hand, a very high thickness of the barrel portion 31 makes it difficult to fix the ring 10 using caulking (flare processing). Hence, it is desirable that the barrel portion 31 has a comparable thickness (in the range of 90% to 110%) to the thickness of the conductor substrate 20.

Figure 6:
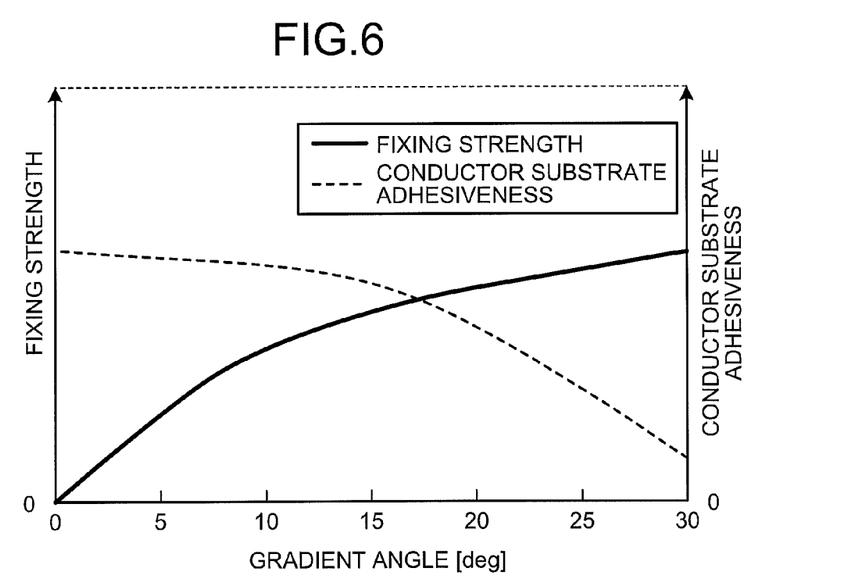
FIG. 6 is a graph representing a relation of fixing strength and adhesiveness between the terminal and the conductor substrate with the gradient angle of a taper according to the first embodiment.

The taper 33 is formed in such a way that insertion thereof in the through-hole 21 of the conductor substrate 20 causes plastic deformation in the rim of the through-hole 21. FIG. 6 is a graph representing a relation of the gradient angle of the taper 33 with fixing strength and adhesiveness between the terminal 30 and the conductor substrate 20. When the gradient angle of the taper 33 is equal to or smaller than 5° with respect to the central axis, then the resistance force against the rotating torque is weak thereby making it difficult to achieve a predetermined fixing strength. In contrast, when the gradient angle of the taper 33 is equal to or greater than 20° with respect to the central axis, then the conductor substrate 20 undergoes warpage and the surface pressure distribution becomes unstable thereby causing deterioration in conductor substrate adhesiveness. Hence, it is desirable that the taper 33 has a gradient angle in the range of 5° to 20° and is particularly desirable that the taper 33 has a gradient angle of 15°±5°. Meanwhile, regarding the gradient height of the taper 33, it is desirable to have the gradient height in the range of about 100% to about 200% of the thickness of the conductor substrate 20 in the axis direction from an edge face 32a of the flange portion 32 and is particularly desirable to have the gradient height of about 150±10%. If the gradient height is too high, then the conductor substrate 20 undergoes warpage; while if the gradient height is too low, then sufficient adhesiveness cannot be achieved between the conductor substrate 20 and the terminal 30.

The through-hole for inserting the tubular barrel portion 31 of the terminal 30 is formed on the ring 10. Moreover, the substrate-side chamfer 11B and the outside chamfer 11A as described above are formed on both ends of the through-hole. At the time of caulking of the barrel portion 31 of the terminal 30, the plastically-deforming part of the opening edge of the barrel portion 31 gets pressed against the chamfer 11A of the ring 10. As a result, a resistance force against the rotating torque or a resistance force against pull-out are generated. Alternatively, a resistance force against the rotating torque or a resistance force against pull-out may also be generated when the taper 33 of the terminal 30 causes plastic deformation in the rim of the through-hole of the conductor substrate 20 so that the rim is expanded outward.

When the outside chamfer 11A makes an angle equal to or smaller than 20° with respect to the central axis, then the caulking force is not easily transmitted; while an angle equal to or greater than 40° causes deterioration in the shape formation using a caulking pin for fastening. Hence, it is desirable to have an angle in the range of 20° to 40° and is particularly desirable to have an angle of 30°±5°. Moreover, it is desirable that the chamfer 11A has a depth in the range of 100% to 200% with respect to the thickness of the barrel portion 31 of the terminal 30 in the axis direction from the edge face of the ring 10. The angle and depth of the outside chamfer 11A determine an insertable depth for a caulking pin for fastening.

Figure 7:
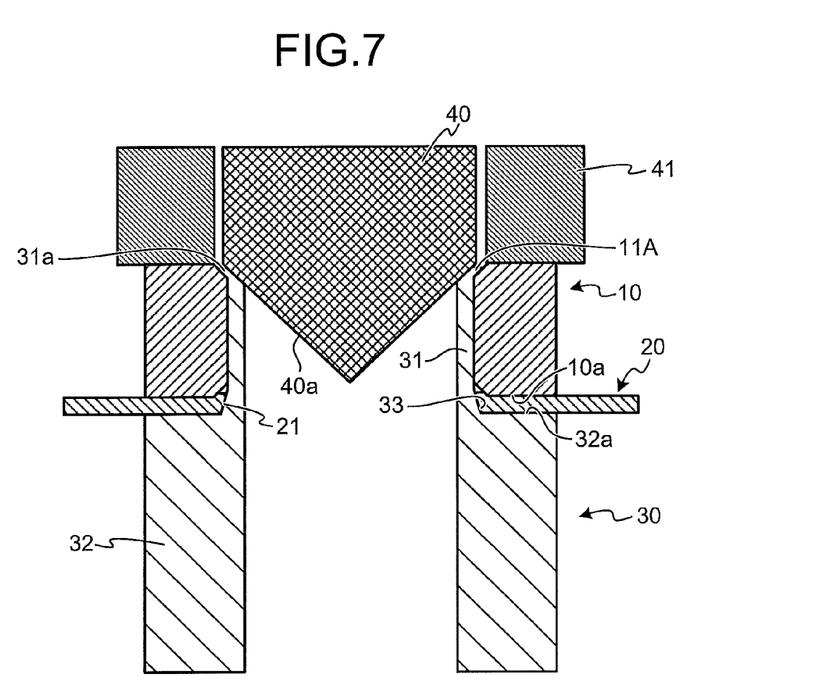
FIG. 7 is a transverse sectional view of a condition when the terminal is joined to the conductor substrate using a caulking pin for fastening.

Explained below is the terminal joining method according to the present embodiment. FIG. 7 is a transverse sectional view of a condition when the terminal 30 is joined to the conductor substrate 20 by caulking the barrel portion 31 with a caulking pin for fastening 40. At the time of fixing the terminal 30 to the conductor substrate 20, the barrel portion 31 of the terminal 30 is first inserted in the through-hole 21 of the conductor substrate 20 and then inserted in the through-hole of the ring 10 so that the conductor substrate 20 is sandwiched between the edge face 32a of the flange portion 32 and an edge face 10a of the ring 10. At that time, by pressing with a ring holding member 41, the taper 33 of the terminal 30 expands the rim of the through-hole 21 of the conductor substrate 20 outward so that the conductor substrate 20 moves inside a gap between the chamfer on the ring 10 and the taper 33 and gets tightly adhered thereat. In that condition, an open end part 31a of the barrel portion 31 of the terminal 30 is caulked (flare processed) outward by a cone-shaped pressing surface 40a of the caulking pin for fastening 40 so that the open end part 31a of the barrel portion 31 adheres tightly to the chamfer 11A of the ring 10. As a result, a caulking reaction force acting on the chamfers at both ends of the ring 10 causes a strong frictional force on each contacting surface. That achieves a joining with a strong resistance force against the screw tightening torque and against pull-out.

Figure 8:
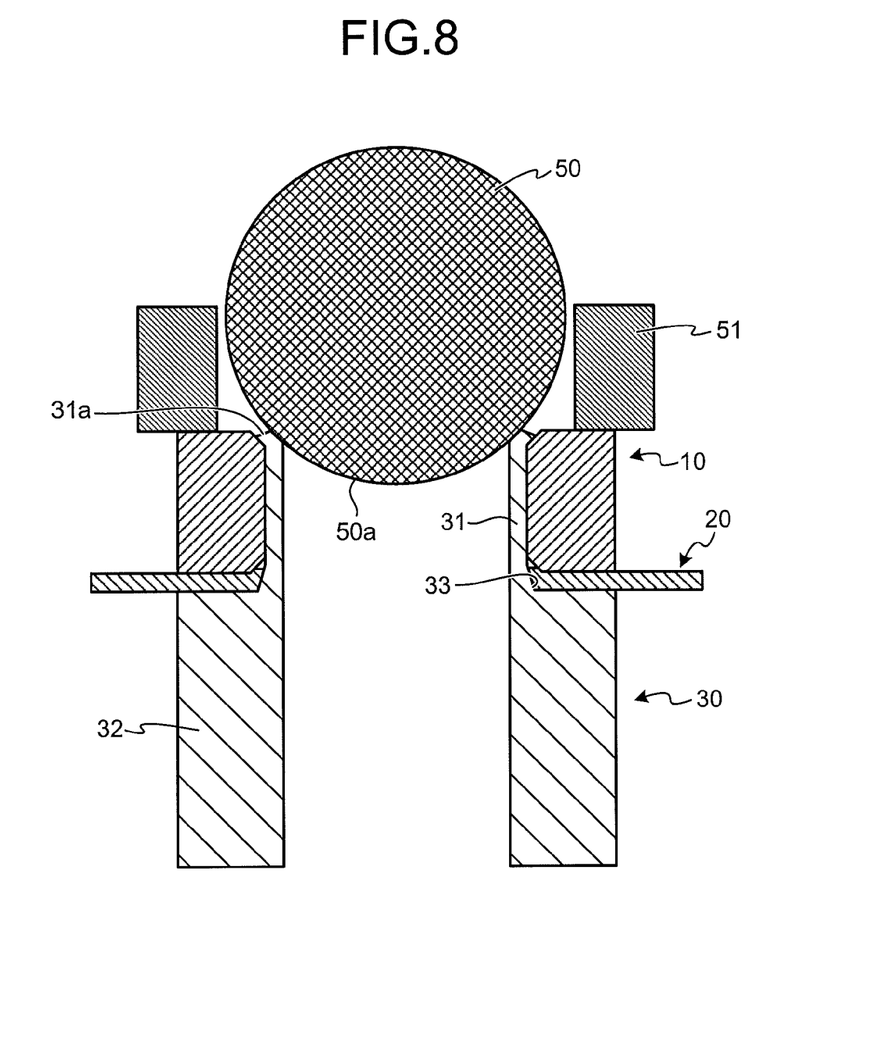
FIG. 8 is a transverse sectional view of a condition when the terminal is joined to the conductor substrate using a caulking pin for fastening that has a different shape.

FIG. 8 is a transverse sectional view of a condition when the terminal 30 is joined to the conductor substrate 20 using a caulking pin for fastening 50 that has a different shape. The shape of a caulking pin for fastening is not limited to the cone shape as illustrated in FIG. 7 but may also be spherical as illustrated in FIG. 8. Moreover, it is desirable that a pressing surface 50a of the caulking pin that eventually abuts against the open end part 31a of the barrel portion 31 makes an angle of a comparable level to the angles of chamfers of the ring 10. For example, when each chamfer of the ring makes an angel of 30°, then it is desirable that the pressing surface 50a of the caulking pin that eventually abuts against the open end part 31a of the barrel portion 31 makes an angle in the range of 20° to 45° and is particularly desirable that the angle is 30°±5°.

Meanwhile, when strength evaluation of a joint region was performed for a prototype that was manufactured from copper as the material and, for example, manufactured with the outer diameter of the barrel portion 31 of the terminal 30 equal to 15 mm (maximum tolerance of 15-0.15 mm and minimum tolerance of 15-0.20 mm), with the gradient of the taper 33 equal to 10°, with the inner diameter of the ring 10 equal to 15±0.05 mm, and with angles of the chamfers 11A and 11B of the ring 10 equal to 30°; then it was confirmed that fastening of the caulking pin for fastening 40, with 25 KN of caulking force applied thereto, to the conductor substrate 20, having thickness of 1.00 mm, has a pull-out strength of at least 3 KN and a rotational resistance torque of at least 5.5 Nm.

Figure 9:
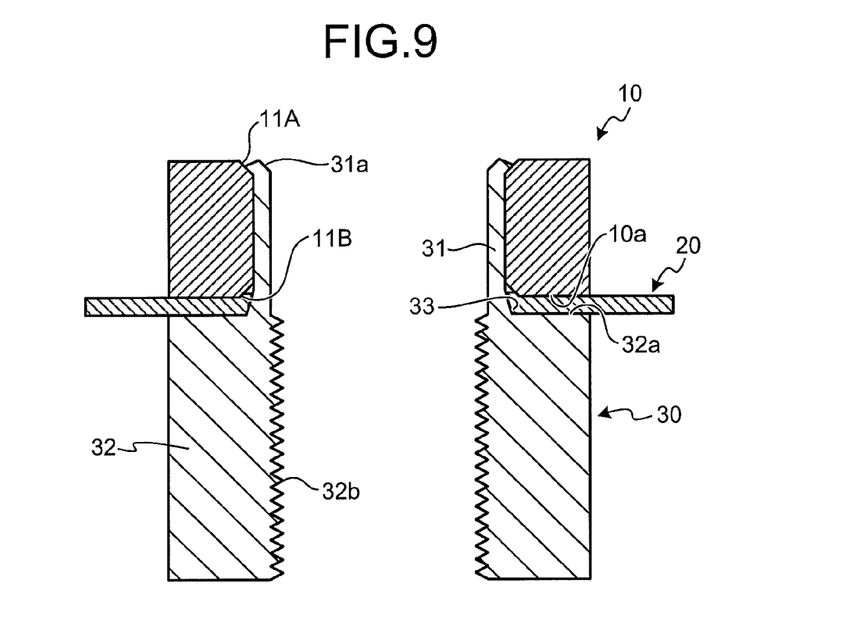
FIG. 9 is a transverse sectional view of another example of the terminal joining structure according to the first embodiment.

FIG. 9 is a transverse sectional view of another example of the terminal joining structure according to the present embodiment. In the terminal joining structure illustrated in FIG. 9, a female screw 32b is threaded on the inner peripheral surface of the thick tubular flange portion 32. In the terminal joining structure having such a structure, for example, another terminal may be screw-coupled to the female screw 32b. Meanwhile, both the barrel portion 31 and the flange portion 32 in the terminal 30 according to the present embodiment are assumed to be tubular in shape. However, as long as at least one end of the barrel portion 31 is formed to be tubular in shape, the open end thereof may be caulked thereby enabling implementation of the present invention.

Second Embodiment

Figure 10:
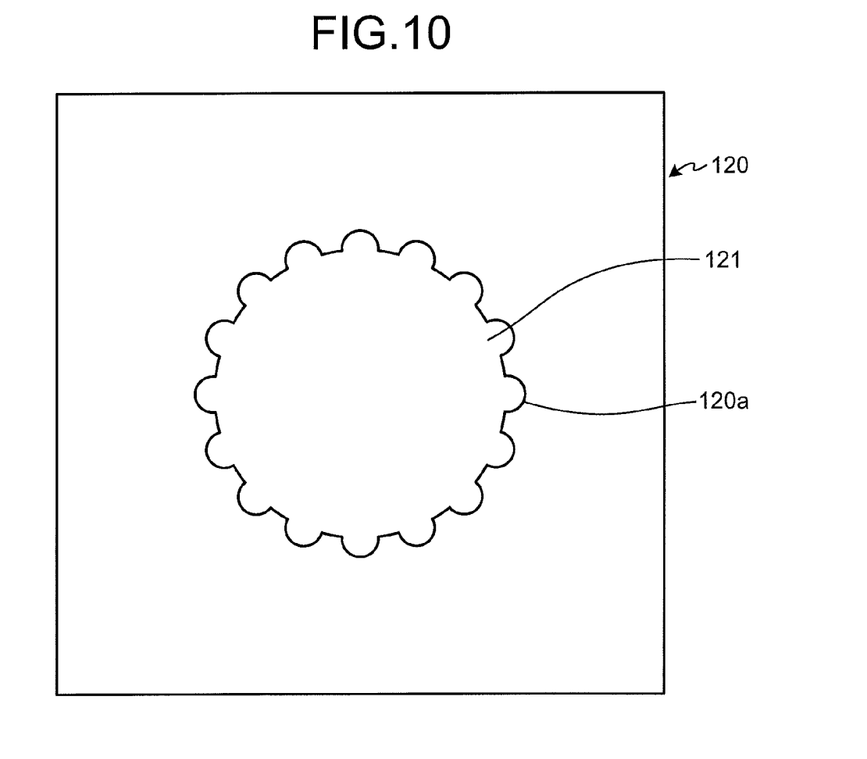
FIG. 10 is a front view of a through-hole formed on a conductor substrate representing a terminal joining structure according to a second embodiment of the present invention.
Figure 11:
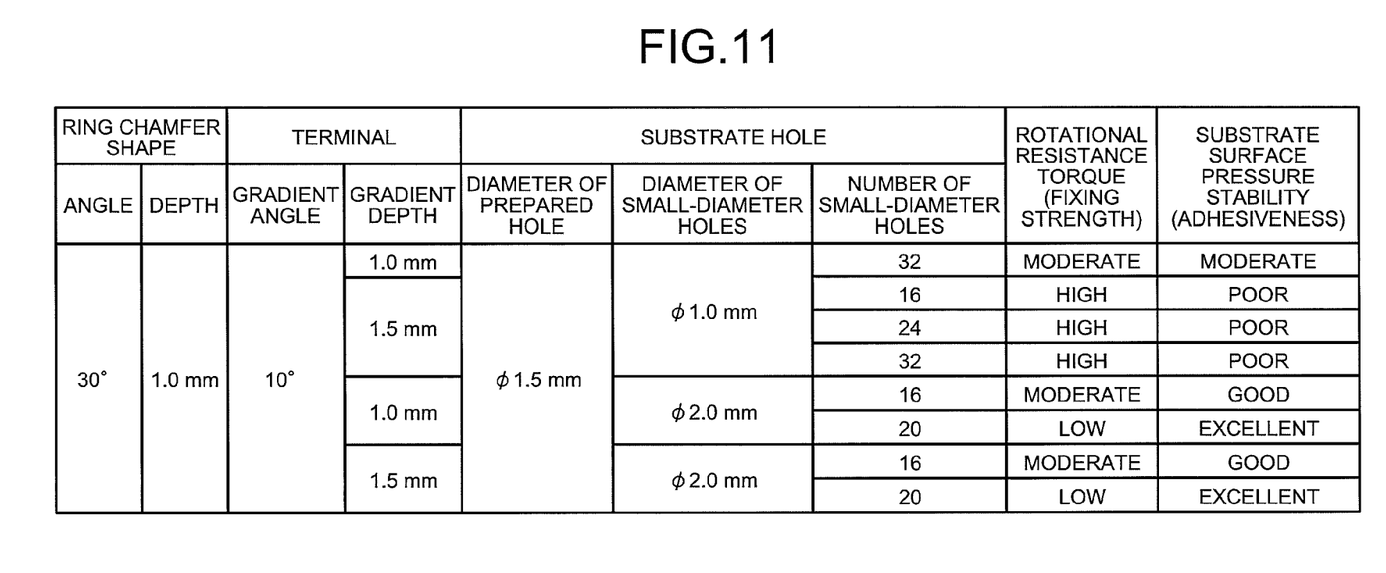
FIG. 11 is a table of rotational resistance torque evaluation and adhesiveness evaluation for a terminal and the conductor substrate according to the second embodiment.

FIG. 10 is a front view of a through-hole formed on a conductor substrate representing a terminal joining structure according to a second embodiment of the present invention. FIG. 11 is a table that illustrates rotational resistance torque evaluation and adhesiveness evaluation for a terminal and the conductor substrate according to the present embodiment. On a conductor substrate 120 according to the present embodiment, a through-hole 121 is formed to have serrations 120a on the rim. Apart from that, the structure is identical to that according to the first embodiment. Since the through-hole 121 in the conductor substrate 120 is formed to have the serrations 120a on the rim, adjusting the warpage of the conductor substrate 120 enables achieving an appropriate joining force. In the present embodiment, the serrations 120a are formed by first punching, on a circle equivalent to the diameter of a prepared hole, small-diameter holes at equal intervals and then punching the prepared hole. If the diameter of the small-diameter holes is relatively large; then, although the rotational resistance torque decreases, the conductor substrate 120 undergoes a smaller warpage and the surface pressure becomes stable thereby improving the adhesiveness. In addition, if the number of small-diameter holes is relatively large; then, although the rotational resistance torque decreases, the conductor substrate 120 undergoes a smaller warpage and the surface pressure becomes stable thereby improving the adhesiveness. Thus, it is desirable that the diameter of the small-diameter holes is in the range of about 150% to about 250% with respect to the thickness of the conductor substrate 120. Besides, it is desirable that the small-diameter holes are arranged in a concentric fashion with respect to the prepared hole at regular intervals and are arranged with the center-to-center spacing therebetween in the range of 1.4 times to 1.6 times of the diameter. For example, for a prototype manufactured with the abovementioned specifications; rotational resistance torque evaluation and adhesiveness evaluation is illustrated in FIG. 11.

Figure 12:
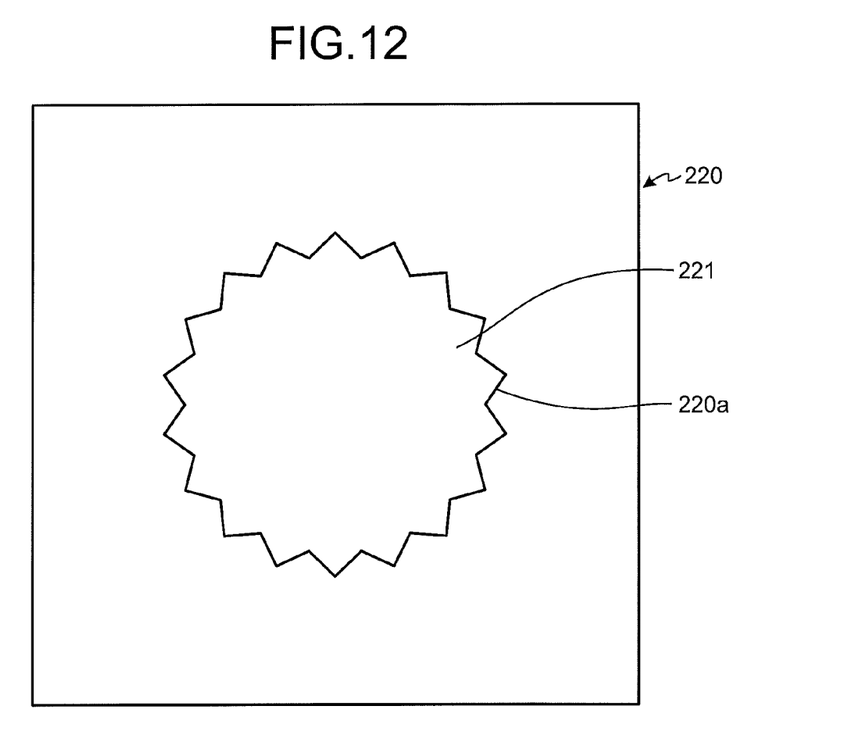
FIG. 12 is a front view of a through-hole formed on a conductor substrate representing another example of a terminal joining structure according to the second embodiment of the present invention.

FIG. 12 is a front view of a through-hole formed on a conductor substrate representing another example of a terminal joining structure according to the second embodiment of the present invention. In a conductor substrate 220 illustrated in FIG. 12, a through-hole 221 is formed to have triangular serrations 220a at the rim. Thus, a through-hole need not have a combination of large and small circles at the rim as illustrated in FIG. 10, but can also have the triangular serrations 220a at the rim as illustrated in FIG. 12. However, from the perspective of manufacturing manageability, a combination of circles is the desirable option.

Third Embodiment

Figure 13:
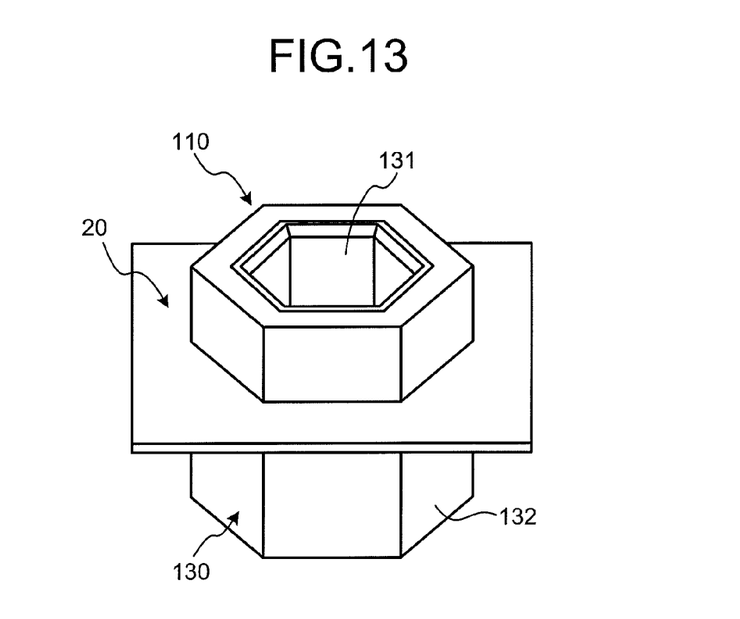
FIG. 13 is a perspective view of a terminal joining structure according to a third embodiment of the present invention in which a terminal has been joined to a conductor substrate.

FIG. 13 is a perspective view of a terminal joining structure according to a third embodiment of the present invention in which a terminal has been joined to a conductor substrate. Herein, the conductor substrate and a ring can have a noncircular cross-section surface perpendicular to the central axis. The terminal joining structure according to the present embodiment includes a terminal 130 with a thin tubular barrel portion 131 in a cross-sectional hexagonal shape and a thick tubular flange portion 132 that is integrally formed at the axis-direction end of the barrel portion 131, which is formed in a cross-sectional hexagonal shape, and includes a ring 110 also in a cross-sectional hexagonal shape. Apart from that, the structure is identical to that described in the first embodiment. By forming the conductor substrate and the ring to have noncircular cross-section surfaces, it becomes possible to tie down the rotation of the terminal.

Fourth Embodiment

Figure 14:
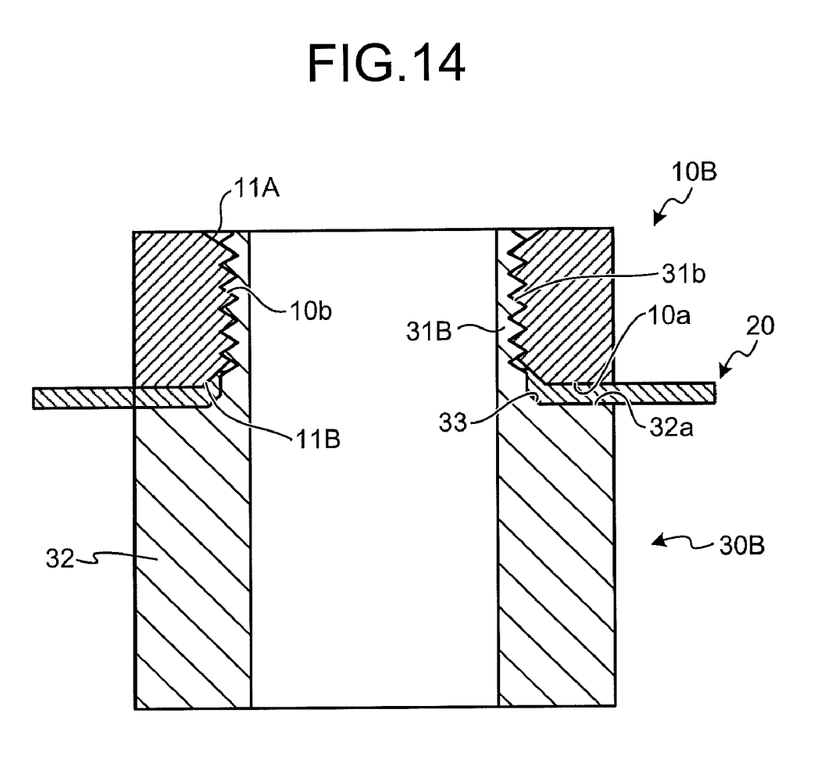
FIG. 14 is a transverse sectional view of a terminal joining structure according to a fourth embodiment of the present invention in which a terminal has been joined to a conductor substrate.

FIG. 14 is a transverse sectional view of a terminal joining structure according to a fourth embodiment of the present invention in which a terminal has been joined to a conductor substrate. In a terminal 30B according to the present embodiment, a male screw 31b is threaded on the inner peripheral surface of a tubular barrel portion 31B. Besides, on the inner peripheral surface of a ring 10B is threaded a female screw 10b. The ring 10B is fixed to the terminal 30B by fastening the female screw 10b with the male screw 31b.

Meanwhile, instead of using the caulking structure at the open end of the barrel portion described in the first three embodiments, the terminal 30B and the ring 10B can also be fixed by performing tapping at the outer peripheral surface of the barrel portion 31B and at the inner peripheral surface of the ring 10B as described in the present embodiment. At the time of sandwiching the conductor substrate 20, the taper 33 and the chamfer 11B cause plastic deformation in the rim of the through-hole on the conductor substrate 20 so that the rim is expanded outward thereby enabling a strong joining of the conductor substrate 20 and the terminal 30B.

INDUSTRIAL APPLICABILITY

In this way, the terminal joining structure and the terminal joining method according to the present invention are suitable for a terminal joining structure used in joining a terminal to a conductor substrate and particularly suitable for a terminal joining structure for high current usage.

The invention claimed is:
1. A terminal joining structure comprising:
a terminal including a thin tubular barrel portion and a thick tubular flange portion that is integrally formed at an axis-direction end of the barrel portion;
a conductor substrate on which a through-hole for inserting the barrel portion is opened; and
a ring that contacts with the and fits on the barrel portion, wherein a substrate-side chamfer is formed at inner diameter of the ring on an end portion of the conductor substrate, wherein an outside chamfer is formed at inner diameter of the ring on opposite side of the conductor substrate,
wherein
a taper that increases in diameter toward the flange portion is formed on the barrel portion, diameter of a larger-diameter portion of the taper being larger than inner diameter of the through-hole, wherein
a rim of the through-hole of the conductor substrate is pressed to the substrate-side chamfer by the taper that is formed on the barrel portion, and gets adhered to the substrate-side chamfer; and
moves inside a gap between the taper of the barrel portion and the substrate-side chamfer of the ring, and gets tightly fixed thereat, and
the terminal is caulked to cause radially outward expansion of an open end side of the barrel portion along the outside chamfer, and is fixed to the conductor substrate together with the ring.
2. The terminal joining structure according to claim 1, wherein the through-hole of the conductor substrate is caulked so as to expand radially outward along the taper of the barrel portion.
3. The terminal joining structure according to claim 1, wherein the through-hole is formed to have serrations at rim.
4. The terminal joining structure according to claim 2, wherein the through-hole is formed to have serrations at rim.
5. The terminal joining structure according to claim 1, wherein the taper has a gradient angle of 15°±5° with respect to a central axis and has an axis-direction height from a flange portion edge face equal to 1.4 times to 1.6 times of thickness of the conductor substrate.
6. The terminal joining structure according to claim 2, wherein the taper has a gradient angle of 15°±5° with respect to a central axis and has an axis-direction height from a flange portion edge face equal to 1.4 times to 1.6 times of thickness of the conductor substrate.

7. The terminal joining structure according to claim 3, wherein the taper has a gradient angle of 15°±5° with respect to a central axis and has an axis-direction height from a flange portion edge face equal to 1.4 times to 1.6 times of thickness of the conductor substrate.

8. The terminal joining structure according to claim 4, wherein the taper has a gradient angle of 15°±5° with respect to a central axis and has an axis-direction height from a flange portion edge face equal to 1.4 times to 1.6 times of thickness of the conductor substrate.

9. The terminal joining structure according to claim 1, wherein the outside chamfer makes an angle 30°±5° with respect to a central axis.

10. A terminal joining method comprising:
opening a through-hole on a conductor substrate for fixing a terminal;
forming, on a barrel portion of a terminal that includes the barrel portion in tubular shape and a flange portion that is integrally formed at an axis-direction end of the barrel portion, a taper that increases in diameter toward the flange portion, diameter of a larger-diameter portion of the taper being larger than inner diameter of the through-hole;
fitting, upon inserting the barrel portion in the through-hole, a ring on the barrel portion on opposite side of the conductor substrate; and
fixing that includes caulking the terminal to cause radially outward expansion of an end, on the opposite side of the conductor substrate, of the barrel portion that passes through the ring and fixing the terminal to the conductor substrate together with the ring.

11. The terminal joining method according to claim 10, wherein, before step of fitting the ring on the barrel portion, a chamfer is formed, in advance, at inner diameter of the ring corresponding to a position at which the barrel portion is caulked.

12. The terminal joining method according to claim 10, wherein, at time of opening a through-hole on the conductor substrate, the through-hole is formed to have tooth-shaped rim.

13. The terminal joining method according to claim 11, wherein, at time of opening a through-hole on the conductor substrate, the through-hole is formed to have tooth-shaped rim.

\* \* \* \* \*